United States Patent [19]

Carballes et al.

[11] 4,238,764

[45] Dec. 9, 1980

[54] SOLID STATE SEMICONDUCTOR ELEMENT AND CONTACT THEREUPON

[75] Inventors: Jean-Claude Carballes; Alain Bodere, both of Paris, France

[73] Assignee: Thomson-CSF, Paris, France

[21] Appl. No.: 915,117

[22] Filed: Jun. 13, 1978

[30] Foreign Application Priority Data

Jun. 17, 1977 [FR] France ................................. 77 18623

[51] Int. Cl.³ ..................... H01L 23/48; H01L 29/46; H01L 29/54
[52] U.S. Cl. ........................................ 357/71; 357/65; 357/68; 357/69; 29/569 L; 29/591
[58] Field of Search ....................... 357/63, 15, 68, 69, 357/71, 67; 29/569, 591

[56] References Cited

U.S. PATENT DOCUMENTS

| | | | |
|---|---|---|---|
| 3,290,127 | 12/1966 | Kahng et al. | 357/65 |
| 3,349,297 | 10/1967 | Crowell et al. | 357/15 |
| 3,585,075 | 6/1971 | Irvin et al. | 357/15 |
| 3,599,060 | 8/1971 | Triggs | 357/69 |
| 3,616,380 | 10/1971 | Lepselter | 357/15 |
| 3,751,292 | 8/1973 | Kongable | 357/69 |
| 3,765,970 | 10/1973 | Athanas | 357/69 |
| 3,840,398 | 10/1974 | Sonntag | 357/71 |
| 3,894,895 | 7/1975 | Khandelwal | 357/81 |
| 3,935,635 | 2/1976 | Botzenhardt | 357/68 |
| 4,051,508 | 9/1977 | Sato et al. | 357/69 |

*Primary Examiner*—Andrew J. James
*Attorney, Agent, or Firm*—Cushman, Darby & Cushman

[57] ABSTRACT

The device has a laser diode with an upper face of gallium arsenide which is partly covered with titanium which forms with the gallium arsenide an ohmic contact of low resistivity. Beneath the gallium arsenide an active layer for emitting light is interposed between two layers with which it forms heterojunction. The assembly is covered with gold which forms with Ga As an ohmic contact of a much higher resistivity. The lines of current and light emission form are thus localized under the titanium.

10 Claims, 5 Drawing Figures

SOLID STATE SEMICONDUCTOR ELEMENT AND CONTACT THEREUPON

The invention relates to a device for making contact with a semiconductor element.

Heterojunction structures based on gallium arsenide are mainly employed in systems of telecommunication through optical fibres. It is therefore of interest in order to obtain a correct coupling of the light emitting components with the optical fibres, to reduce as far as possible the dimensions of their active parts.

Several methods have been employed for this purpose: implantation of protons to render certain zones insulating, etching of the so-called "mesa" type to eliminate certain useless zones etc.

All these methods have the drawback of being liable to deteriorate the active parts of the component.

The device for making a contact on a semiconductor element according to the invention comprises, on the contact-carrying face, a first metallic zone which forms with the semiconductor an ohmic contact of low resistivity and a deposit, on at least a part of said surface, of a second metallic zone which covers said first zone and forms with the semiconductor itself a contact of high resistivity.

The invention will be better understood from the ensuing description with reference to the accompanying drawings in which:

FIG. 1 shows a monocrystalline gallium arsenide substrate 1 having transverse dimensions on the order of 100 microns to 300 microns and cleaved on two opposed faces so that these two plane and parallel faces longitudinally define an resonator optical cavity.

Figure 1:
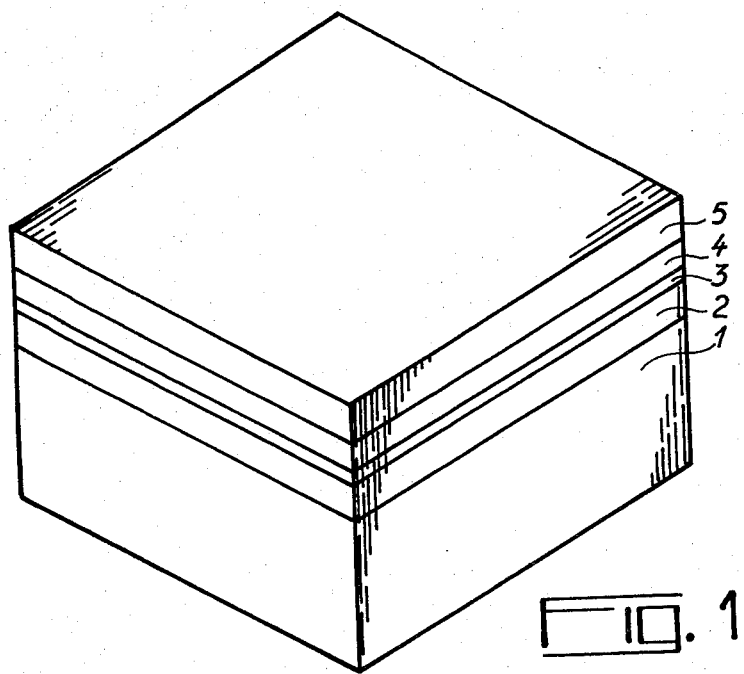
FIGS. 1, 2, 3 and 4 show the various stages of manufacture of a "laser" diode comprising a contact-making device according to an invention.

This substrate has for example n-type conductivity and is highly doped, namely some $10^{18}$ at/cm$^3$.

A first layer 2 is deposited by epitaxy upon this substrate which has a thickness on the order of a micron and the same type of conductivity but a chemical composition of the kind $Ga_{1-x}Al_xAs$ and is less doped.

This epitaxy can be effected in a liquid phase in a bath of gallium between 800° and 960° C. which is saturated with gallium arsenide and also contains aluminium in solution. Methods of this kind are well known in the art. x may vary from 0.1 to 0.3. This layer is of n-type but has a doping of for example from $10^{16}$ to $10^{18}$ at/cm$^3$. Formed on this layer by epitaxy by the same method is a new layer which will be the seat of the emission of light and has a composition $Ga_{1-y}Al_yAs$, with $y<x$.

This layer 3 will have a thickness on the order of 0.1 to 1 micron and its type of conductivity is immaterial. The sole condition is that the width of its forbidden band be smaller than that of the layers which are next to it. Deposited on this layer by the same method is a layer 4 of different composition $Ga_{1-x'}Al_{x'}As$, with $x'$ in the neighbourhood of 0.3 and doped p-type, the thickness being on the same order of magnitude as the layer 2. Deposited on this last layer is a terminal layer 5 of gallium arsenide which is highly doped of p=-type and has a thickness on the order of a micron.

This provides a diode having a double heterojunction and it is known that for a voltage range directly biassing the diode, the zone 3 may be the seat of electro-luminescence phenomena. To make a laser therefrom, this phenomenon must be localized in a resonant cavity, that is to say a cavity all the edges of which are determined with high precision.

In known systems, etchings of the "mesa" type are for example effected on by proton bombardment and, by masking, certain parts of the aforementioned layers are rendered insulating. These methods are difficult to carry out.

Figure 2:
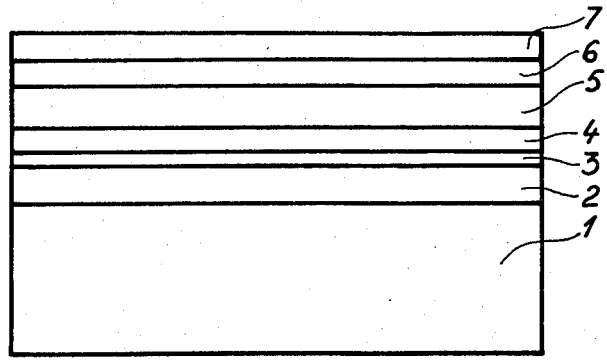
Figure 3:
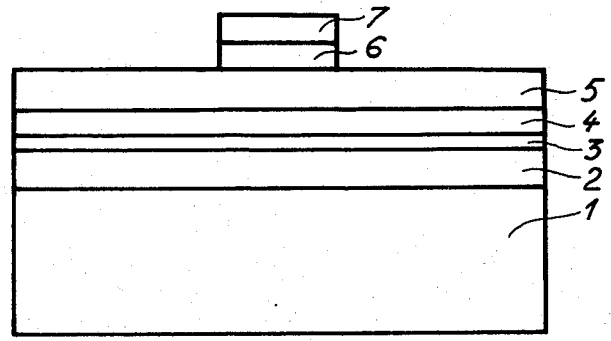
Figure 4:
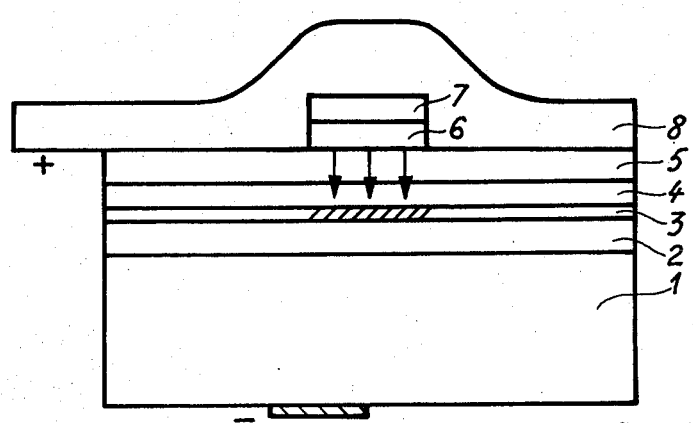

The localization method and the component obtained are illustrated in FIGS. 2, 3 and 4.

In FIG. 2, it is seen that there has been deposited, for example by evaporation in vacuo a layer 6 of titanium extending from one cleared face to the other, and then on this layer a layer 7 of platinum for protecting the layer of titanium against oxydation and performing the function of a barrier layer. A ribbon may obtained after deposition of the two layers of metal on the assembly by chemical or ionic etching through a mask (FIG. 3).

In FIG. 4, there has been deposited on the assembly, a layer 8 of gold having a thickness relatively high with respect to the thickness of the platinum-titanium assembly. For example, the layer of gold may have a thickness exceeding 5000 Angstroms and that of the titanium and platinum may be on the order of 500 Angstroms and 1000 Angstroms respectively.

Figure 5:
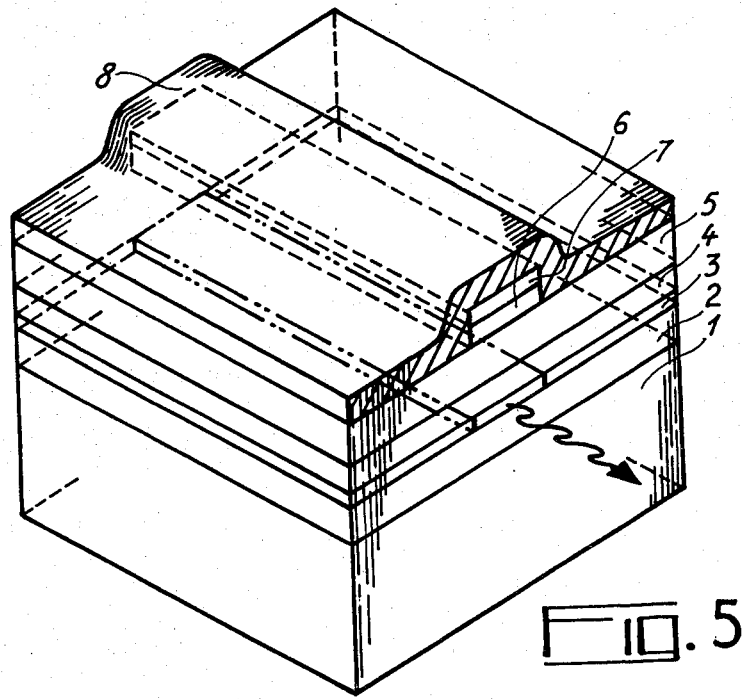
FIG. 5 shows in perspective the "laser" diode obtained by the above described method.

FIG. 4 shows the lines of current when the diode is directly biassed; the lines of current are substantially localized under the layer of titanium. Indeed, the contact resistance Ti/Ga is low (less than $10^{-5}$ ohms.cm$^{-2}$). The contact resistance Or/As Ga is much higher (greater than $10^{-4}$ ohms.cm$^{-2}$). The lines of current remain substantially parallel and arrive at the active zone in a direction perpendicular to its two epitaxial faces. The assembly is such as shown in FIG. 5 in which the contact system and the active zone can be seen. It can be seen that the zone 3 emits solely in the part thereof which faces the titanium ribbon. This zone is localized in a cavity the two end faces of which are the two cleaved faces of the substrate. It is laterally defined by the respective extensions along the lines of current of the two lateral walls which determine the width of the titanium/platinum ribbon. This cavity has all the characteristics of a cavity of the FABRY-PEROT type and is therefore the seat of a coherent luminous emission when the diode is excited. Its width may be on the order of 6 μm, and the radiation occurs in the direction of the arrow. Experience has shown that when the width of the defining ribbon does not exceed 6 μm, a more even distribution of the emission along the transverse section of the emitting zone is obtained. Moreover, the two emitting faces provide substantially equal radiations and the curve of the variation of the chosen power as a function of the injected current is more linear.

In the case of an ionic etching with oxygen ions, the platinum protects the titanium against oxidation. Moreover, as it constitutes a barrier layer, it avoids the undesirable phenomenon of diffusion toward the gold layer.

Bombardment with oxygen atoms has for effect to superficially oxidize the gallium arsenide and there results an increase in the contact resistance Au—As Ga.

Note that in respect of the emitted radiations (infrared), the largest transverse dimension of the cavity is on the order of 5 to 10 μm. Indeed, for such dimensions, the response curve of the diode is linear and there is an optimum distribution of the emitted energy.

The titanium and the platinum may be replaced by chromium and palladium respectively.

The gold layer is thick enough to serve as contact-making means and ensure the strength of the assembly.

It will be understood that the invention may be employed in other applications.

What we claim is:

1. An electroluminescent diode:
   a plurality of semiconductive layers having a face and including an active light emitting layer,
   a first layer of a first metal forming on said face an ohmic contact of low resistivity and partly covering said face, and
   a second layer of a second metal partly covering said first layer and at least part of said face and forming with said face a contact of much higher resistivity than said contact formed by said first layer, the lines of current and the light emitted from said active layer being localized under said first layer.

2. A diode as claimed in claim 1, including a third layer of a third metal which completely covers said first layer and is inserted between said first layer and said second layer and forms a barrier layer between said first and second layers.

3. A diode as claimed in claim 2, wherein said face is made from gallium arsenide, said first metal being chosen from the group consisting of titanium and chromium, the second layer from gold, the third layer from the group consisting of platinum and palladium.

4. A diode as claimed in claim 3, wherein said active layer is interposed between two layers with which it forms two heterojunctions respectively.

5. A diode as claimed in claim 4, wherein said first layer of metal is in the form of a ribbon and a semiconductor has two cleved end faces, and said diode is of the "laser" type.

6. A method for making an electroluminescent diode comprising the following successive steps:
   deposition of a first layer of a first metal on a face of a plurality of layers including a light emitting layer, said first metal forming with the substrate a contact of low resistivity;
   eliminating a part of said layer;
   deposition on the assembly of a second layer of a second metal forming with said substrate a contact of high resistivity so that the lines of current and the light emitted from said active layer are localized under said first layer.

7. A method as claimed in claim 6, wherein a third layer of a third metal is deposited on the first layer prior to the deposition of the second layer, said second layer being subjected to the same eliminating operations as the first layer so as to remain solely on said first layer.

8. A method as claimed in claim 6, wherein the semiconductor is made from gallium arsenide and the first metal is selected from the group consisting of titanium and chromium.

9. A method as claimed in claim 8, wherein the second metal is gold and the third chosen from the group consisting of platinum and palladium.

10. A method as claimed in claim 6, wherein the elimination of the first and third layers is effected by ionic machining with oxygen ions.

* * * * *